(12) United States Patent
Bedell et al.

(10) Patent No.: US 9,570,485 B2
(45) Date of Patent: Feb. 14, 2017

(54) SOLAR-POWERED ENERGY-AUTONOMOUS SILICON-ON-INSULATOR DEVICE

(71) Applicant: International Business Machines Corporation, Armonk, NY (US)

(72) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/955,020

(22) Filed: Nov. 30, 2015

(65) Prior Publication Data

US 2016/0086983 A1    Mar. 24, 2016

Related U.S. Application Data

(60) Continuation of application No. 14/530,280, filed on Oct. 31, 2014, now Pat. No. 9,219,187, which is a
(Continued)

(51) Int. Cl.
*H01L 31/06* (2012.01)
*H01L 27/142* (2014.01)
(Continued)

(52) U.S. Cl.
CPC ............. *H01L 27/142* (2013.01); *H01L 21/84* (2013.01); *H01L 27/092* (2013.01);
(Continued)

(58) Field of Classification Search
CPC ............... H01L 31/068; H01L 31/1892; H01L 31/02008; H01L 21/84; H01L 31/08; H01L 31/02168; H01L 31/0516; H01L 21/0682
(Continued)

(56) References Cited

U.S. PATENT DOCUMENTS 7,307,003 B2 *  12/2007  Reif ................... H01L 21/6835
                                                         257/701
8,906,779 B2   12/2014  Bedell et al.
(Continued)

OTHER PUBLICATIONS

Chang-Lee Chen, SOI Circuits Powered by Embedded Solar Cell, SOI Conference (2011), pp. 1-2.
(Continued)

*Primary Examiner* — Jarrett Stark
*Assistant Examiner* — Shahed Ahmed
(74) *Attorney, Agent, or Firm* — Louis J. Percello; Otterstedt, Ellenbogen & Kammer, LLP (57) ABSTRACT

A solar-powered autonomous CMOS circuit structure is fabricated with monolithically integrated photovoltaic solar cells. The structure includes a device layer including an integrated circuit and a solar cell layer. Solar cell structures in the solar cell layer can be series connected during metallization of the device layer or subsequently. The device layer and the solar cell layer are formed using a silicon-on-insulator substrate. Subsequent spalling of the silicon-on-insulator substrate through the handle substrate thereof facilitates production of a relatively thin solar cell layer that can be subjected to a selective etching process to isolate the solar cell structures.

25 Claims, 6 Drawing Sheets

Related U.S. Application Data division of application No. 13/717,684, filed on Dec. 17, 2012, now Pat. No. 8,906,779.

(60) Provisional application No. 61/617,846, filed on Mar. 30, 2012.

(51) Int. Cl.
| | |
|---|---|
| *H01L 31/18* | (2006.01) |
| *H01L 31/068* | (2012.01) |
| *H01L 21/84* | (2006.01) |
| *H01L 27/12* | (2006.01) |
| *H01L 27/092* | (2006.01) |
| *H01L 31/05* | (2014.01) |

(52) U.S. Cl.
CPC ...... *H01L 27/1203* (2013.01); *H01L 31/0504* (2013.01); *H01L 31/068* (2013.01); *H01L 31/1892* (2013.01); *Y02E 10/547* (2013.01)

(58) Field of Classification Search
USPC .... 257/13, 21, 72, 79, 184, 347; 438/67, 72, 438/116
See application file for complete search history.

(56) References Cited

U.S. PATENT DOCUMENTS

| | | | |
|---|---|---|---|
| 2006/0105509 | A1 | 5/2006 | Zia |
| 2008/0128868 | A1* | 6/2008 | Aspar ............... H01L 21/76256 257/629 |
| 2009/0072290 | A1 | 3/2009 | Cheng |
| 2009/0209084 | A1* | 8/2009 | Nunan ............. H01L 21/76254 438/458 |
| 2010/0311250 | A1 | 12/2010 | Bedell |
| 2011/0048517 | A1 | 3/2011 | Bedell |
| 2012/0118383 | A1 | 5/2012 | Bedell |
| 2013/0112256 | A1* | 5/2013 | Yu ..................... H01L 31/02168 136/256 |
| 2013/0307112 | A1 | 11/2013 | Baars |
| 2014/0045730 | A1 | 2/2014 | Walters |
| 2015/0050769 | A1 | 2/2015 | Bedell |

OTHER PUBLICATIONS

Sahar Ayazian, Delivering Optical Power to Subcutaneous Implanted Devices, 33rd Annual International Conference of the IEEE EMBS, Aug. 30-Sep. 3, 2011, pp. 2874-2877.

Jiwu Lu, Integration of Solar Cells on Top of CMOS Chips Part I: a-Si Solar Cells, IEEE Transactions on Electron Devices, vol. 58, No. 7, Jul. 2011, pp. 2014-2021.

* cited by examiner

FIG. 2C
LOCAL

FIG. 2B
CONTINUOUS

FIG. 3

FIG. 4

SOLAR-POWERED ENERGY-AUTONOMOUS SILICON-ON-INSULATOR DEVICE

CROSS REFERENCE TO RELATED APPLICATIONS

This application is a continuation of U.S. patent application Ser. No. 14/530,280, which is a divisional of U.S. patent application Ser. No. 13/717,684, which in turn claims the benefit of U.S. Provisional Application No. 61/617,846. The complete disclosures of U.S. patent application Ser. No. 14/530,280, U.S. patent application Ser. No. 13/717,684, and U.S. Provisional Application No. 61/617,846 are expressly incorporated by reference herein in their entireties for all purposes.

FIELD

The field of the present disclosure relates to the physical and electrical sciences, and particularly to silicon-on-insulator (SOI) complementary metal-oxide-semiconductor (CMOS) devices and integrated circuits including such devices.

BACKGROUND

There is a demand for energy-autonomous 'smart' sensors and integrated circuits utilizing energy harvesting schemes. Prominent examples include sensor network nodes, biomedical implants and wearable devices, and burst-mode wireless transceivers. Recent advances in nanoelectronics allow monolithic integration of 'smart' sensors with self-contained sensing, computation, communication and power source to obtain reasonably small sensors. Many sensor applications will require total power as low as 100 µW when using advanced low-power circuits.

The voltage output of a stand-one silicon-based solar cell is typically not sufficient to drive a high-performance transistor. As a result, the transistor will operate near or at the sub-threshold regime. Large area CMOS diodes can be used as photovoltaic components for harnessing fringe light and powering a chip, but such diodes inhibit the use of advanced CMOS technology.

SUMMARY

Aspects of the present disclosure relate to solar-powered structures and methods for fabricating such structures.

A first exemplary method includes obtaining a silicon-on-insulator substrate including a semiconductor layer, a handle substrate, and an insulating layer between the semiconductor layer and handle substrate, the silicon-on-insulator substrate including a plurality of solar cell structures. A device layer comprising an integrated circuit is formed on the semiconductor layer of the silicon-on-insulator substrate. The method further includes connecting the solar cell structures in series, attaching a stressor layer to the silicon-on-insulator substrate over the device layer, attaching a flexible handle layer to the stressor layer, cleaving through the handle substrate by exerting a force on the flexible handle layer, separating a cleaved portion of the handle substrate from the handle substrate, leaving a thin handle layer attached to the device layer and comprising the plurality of solar cell structures, and removing a selected portion of the thin handle layer, thereby electrically isolating the solar cell structures from each other.

A second exemplary method includes obtaining a structure including i) a silicon-on-insulator substrate comprising a handle substrate, a semiconductor layer, an insulating layer between the handle substrate and semiconductor layer, and a plurality of solar cell structures connected in series with each other, ii) a device layer comprising an integrated circuit on the semiconductor layer of the substrate, iii) a stressor layer secured to the structure above the device layer, and iv) a flexible handle layer secured to the stressor layer. The method further includes cleaving through the handle substrate of the silicon-on-insulator substrate by exerting a force on the flexible handle layer, separating a cleaved portion of the handle substrate beneath the fracture from the substrate, leaving a thin handle layer comprising the plurality of solar cell structures attached to the device layer, and removing a selected portion of the thin handle layer, thereby electrically isolating the solar cell structures from each other.

A method in accordance with a third aspect includes obtaining a silicon-on-insulator substrate including a semiconductor layer, a handle substrate, and an insulating layer between the semiconductor layer and handle substrate, the silicon-on-insulator substrate including a first highly doped contact region having a first doping type adjoining the insulating layer, forming a device layer comprising an integrated circuit on the semiconductor layer of the silicon-on-insulator substrate, attaching a stressor layer to the silicon-on-insulator substrate over the device layer and attaching a flexible handle layer to the stressor layer. The method further includes cleaving through the handle substrate by exerting a force on the flexible handle layer, separating a cleaved portion of the handle substrate from the substrate, leaving a thin handle layer attached to the device layer and comprising the first highly doped contact region adjoining the insulating region and an exposed surface, forming a second highly doped contact region on the exposed surface of the thin handle layer, the second highly doped contact region having a second doping type opposite to the first doping type, forming first and second isolated solar cell structures from the thin handle layer and the first and second highly doped contact regions, and connecting the solar cell structures in series.

An exemplary structure includes a silicon-on-insulator substrate including a semiconductor layer, a handle layer having a thickness of fifty microns or less, and an insulating layer between the semiconductor layer and handle layer, the handle layer including a plurality of electrically isolated solar cell structures. A device layer comprising an integrated circuit is on the semiconductor layer of the silicon-on-insulator substrate. At least two of the solar cell structures are electrically connected in series. An electrical connection is provided between the series connected solar cell structures and the integrated circuit.

A second exemplary structure includes a silicon-on-insulator substrate including a semiconductor layer, a handle layer, and an insulating layer between the semiconductor layer and handle layer. The handle layer includes a photosensitive base portion, a plurality of highly doped first contact regions adjoining the insulating layer, and a plurality of highly doped second contact regions adjoining the insulating layer, the first contact regions having a doping type opposite to the doping type of the second contact regions. A device layer comprising a complementary metal-oxide-semiconductor (CMOS) circuit is on the semiconductor layer of the silicon-on-insulator substrate; a stressor layer is attached to the device layer and a flexible handle layer is attached to the stressor layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enables monolithic integration of solar cell structures;
Optional circuit mechanical flexibility;
Facilitates isolation process and serial connection of individual solar cell structures to increase the output voltage.

These and other features and advantages of the present disclosure will become apparent from the following detailed description of illustrative embodiments thereof, which is to be read in connection with the accompanying drawings.

DETAILED DESCRIPTION

The voltage output of a stand-alone silicon-based solar cell is typically not sufficient to drive a high-performance transistor. As a result, the transistor will operate near or at the sub-threshold regime. A monolithic integration of solar cells is fabricated on a handle substrate in accordance with aspects of the present disclosure. The process is facilitated by using controlled spalling technology such as disclosed in Pub. Nos. U.S. 2010/0307572 and U.S. 2011/0048517, which are incorporated by reference herein. Structures are obtained having monolithically integrated solar cells on a silicon handle layer that are connected in series to increase voltage output of the photovoltaic component. In other words, solar cells are monolithically integrated on the handle layer and then the diodes comprising the solar cells are cascaded in series to add the output voltage of each diode. The use of a relatively thick handle layer in the disclosed method ensures sufficient mechanical support during device processing. The controlled spalling technique allows separating a thin handle layer of the handle substrate (from a few microns to tens of microns) of a silicon-on-insulator structure. The resulting, relatively thin handle layer allows proper electrical isolation and serial connection of individual solar cells.

In an exemplary embodiment, three technologies are utilized to enable the monolithic integration of solar cells with integrated circuits (ICs): (i) Silicon-on-insulator (SOI) technology for CMOS ICs, (ii) Si solar cell technology implemented in the handle Si of the SOI substrate, and (iii) controlled spalling technology for kerf-free silicon release. Typical conversion efficiency of a high-end silicon-based solar cell is about 20%, i.e., about 200 $\mu$W/mm$^2$. This power should be sufficient to energize smart sensors made with state-of the-art low-power CMOS technology. In order to avoid using up the prime silicon "real-estate" on the IC chip itself for fabricating solar cells, an exemplary method as disclosed herein provides monolithic integration of high efficiency solar cells in the handle Si of a SOI substrate under the insulating (e.g. buried oxide (BOX)) layer. The handle Si typically acts only as a mechanical support for SOI devices and contains no active devices. Therefore, the integration scheme being proposed here will have no effect on the prime real estate in the SOI layer.

In an energy-autonomous circuit, one possible paradigm is to harness the solar cell generated power for re-charging a battery. This will require an energy scavenger that produces voltage greater than that of the battery. Since the output voltage of a stand-alone Si solar cell is limited to 0.5-0.8 V which is much smaller than the required battery voltage (>1.5 V), multiplication of the solar cell output voltage is necessary for charging the battery. Although there are proposed circuit-level solutions such as voltage adder/multiplication circuits, such circuits require additional power for operation. Additionally, this approach may take up prime Si real-estate on the chip.

Figure 1A:
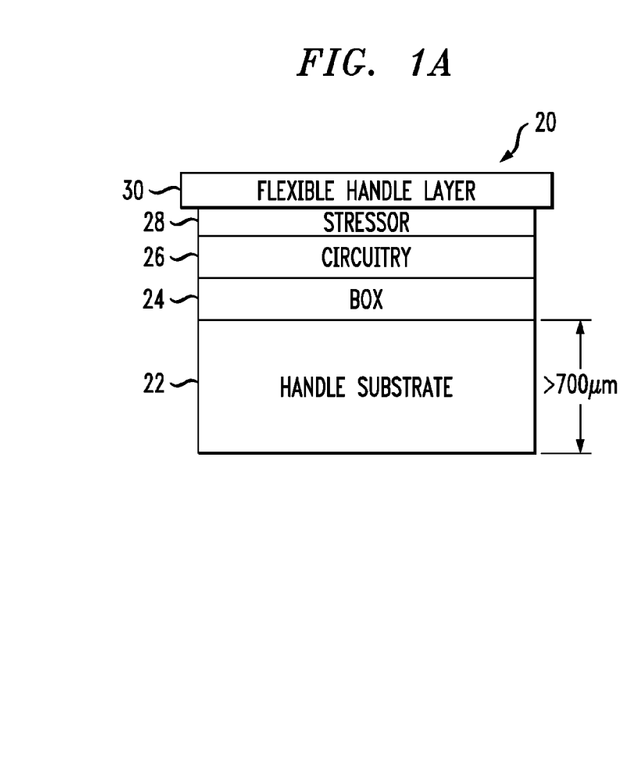
FIGS. 1A-D show a flow diagram showing the processing of a structure to obtain isolated solar cell structures that are connected in series.
Figure 1B:
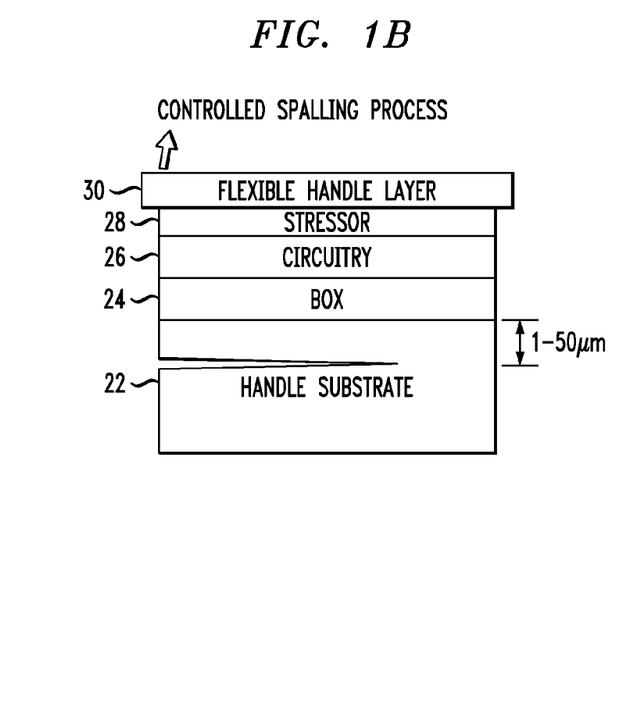

In accordance with the present disclosure, monolithic integration of solar cells is performed in the handle substrate and cascading of the solar cells is done in series to increase the output voltage of the energy scavenger. The thick handle substrate (typically >700 $\mu$m) used for typical CMOS processing inhibits realization of such an approach. To surmount this challenge, controlled spalling technology, such as described with respect to FIGS. 1A-B, is employed to release the top 1-50 $\mu$m (typically 20-50 $\mu$m) of the Si handle substrate. The resulting structure will include the SOI layer with IC circuitry, BOX layer, and a portion of the handle substrate under the BOX layer (FIG. 2C). The relatively thin handle substrate obtained after spalling will facilitate subsequent isolation process and serial connection of individual solar cells via the back of the wafer.

Referring to FIGS. 1A-D, a flow chart illustrating steps of a manufacturing method is shown. FIG. 1A shows a structure 20 obtained following initial steps as described in part above. The structure 20 includes a SOI substrate comprised of a relatively thick handle substrate 22 comprising silicon in one or more embodiments, an insulating layer 24 (a buried oxide layer such as silicon dioxide in this exemplary embodiment), and a semiconductor layer. The semiconductor layer is comprised of crystalline silicon and is not shown as a separate element in FIG. 1A. The structure further includes a device layer 26 formed on the top semiconductor layer of the SOI substrate. The device layer in this embodiment comprises one or more CMOS devices (e.g. field effect transistors, bipolar junction transistors, non-volatile memory cells, etc). It is understood that CMOS devices do not necessarily comprise metals or oxides, and that doped conductors and insulators other than oxides may comprise such devices. A stressor layer 28, preferably comprising a thin metal layer (e.g. a few microns of nickel) is formed on the device layer. A flexible handle layer 30 made from polyimide or other suitable material is bonded to the stressor layer 28. It will be appreciated that the stressor layer may be deposited directly on the device layer as shown or indirectly. An intermediate layer (not shown) may optionally be provided between the device layer and stressor layer.

In an exemplary SOI substrate, a buried oxide (BOX) film comprising silicon dioxide may be formed on a silicon substrate and a single crystal silicon thin film is formed thereon. Various methods of fabricating such SOI substrates are known, one of which is Separation-by-Implanted Oxygen (SIMOX), wherein oxygen is ion implanted into a single crystal silicon substrate to form a BOX film. Another method of forming an SOI substrate is wafer bonding, wherein two semiconductor substrates with silicon oxide surface layers are bonded together at the silicon oxide surfaces to form a BOX layer between the two semiconductor substrates. SOI substrates are also commercially available. The handle substrate 22 of a SOI substrate is thick (for example, greater than seven hundred microns in thickness) to facilitate CMOS processing. The thickness of the top semiconductor layer depends on the circuitry to be formed thereon. Typical top semiconductor thickness can range from three nanometers (3 nm) to two microns (2 μm).

One or more doped regions can be formed in the handle substrate 22 during manufacture of the SOI substrate or thereafter. For example, a heavily doped region can be grown epitaxially on a lightly doped silicon substrate. Depending on the doping type, the heavily doped region can function as an emitter or a back surface field (BSF) layer. Alternatively, the entire solar cell structure, comprising of the emitter, absorber layer and the back/front surface field can be epitaxially grown on the handle substrate. Ion implantation is another doping method familiar to those of skill in the art that can be employed. As discussed above, heavily doped solar cell anode and cathode terminals can be formed under the BOX layer at the outset of the formation of the CMOS device layer on the top semiconductor layer. The formation of CMOS devices on SOI substrates is familiar to those of skill in the art. The device layer may include any appropriate number, type and configuration of CMOS devices. The device layers shown and described hereafter should be considered exemplary as opposed to limiting.

Figure 1C:
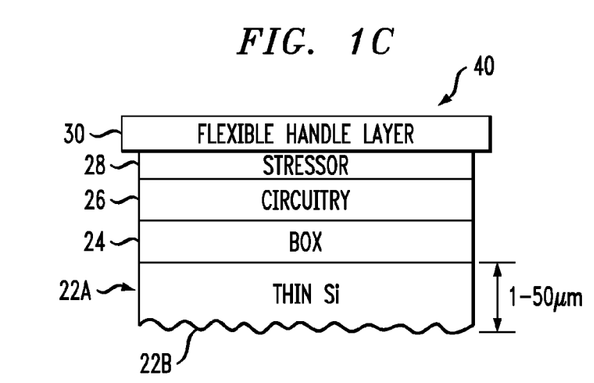

Referring to FIG. 1B, shear stress is applied by means of the flexible handle structure 30 to spall a layer of the host handle substrate 22. Controlled spalling as shown herein is performed to cleave through the handle substrate 22 beneath the BOX layer 24. A relatively thin handle layer 22A as shown in FIG. 1C will accordingly remain on the structure following spalling. The thin handle layer 22A preferably has a thickness of one to fifty microns (1-50 μm) in the exemplary embodiment. The spalling procedure is conducted after finishing circuit processing in some embodiments. In other words, the host handle substrate is spalled following both solar cell formation and device layer formation in some embodiments. As discussed further below, additional steps may follow spalling to complete the formation of solar cell structures in other embodiments. US Pub. No. 2010/0311250, which is incorporated by reference herein, further discusses thin substrate fabrication wherein controlled spalling techniques are employed.

Figure 1D:
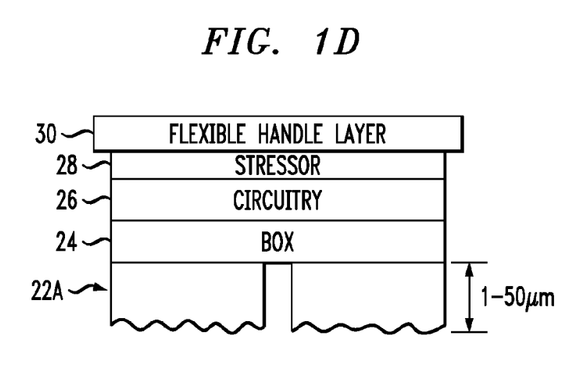

As shown in FIG. 1C, the bottom surface 22B of the handle layer 22A of the resulting structure 40 may be optionally textured to improve light trapping. The texturing is greatly exaggerated in the Figure. Referring to FIG. 1D, a mesa patterning is performed by Si selective etching down to the BOX layer 24. In embodiments where solar cell structures have already been formed in the structure 40, the selective etching isolates the solar cell structures from each other. Cascading of the solar cell structures is accordingly feasible. In embodiments where further processing is necessary to complete the solar cell structures, the selective etching facilitates isolation of the solar cell structures once completed so that they can be operated in series to increase the voltage output.

Figure 2A:
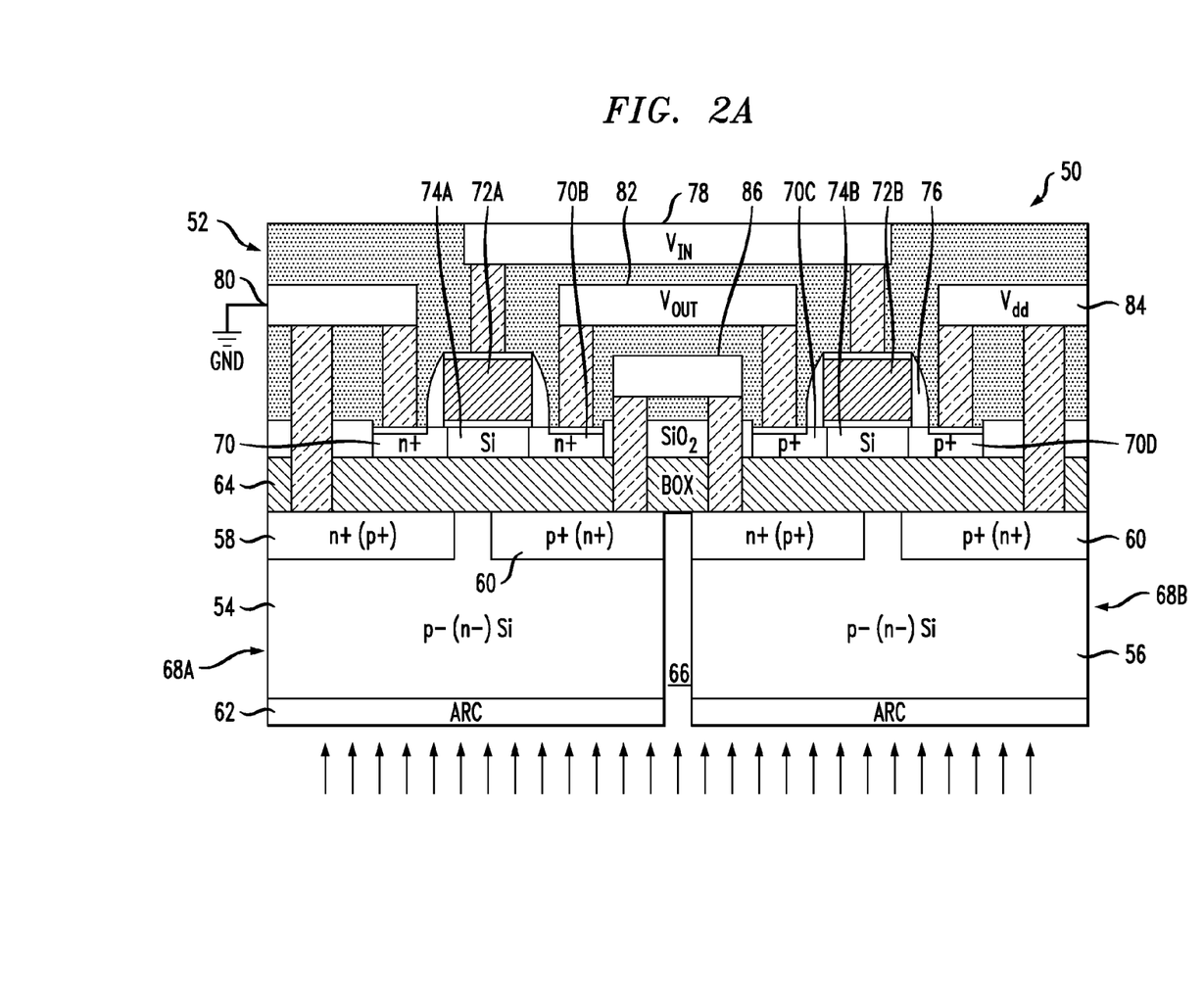
FIG. 2A is a schematic illustration of a structure having series connected solar cell structures in accordance with a first exemplary embodiment.
Figure 2B:
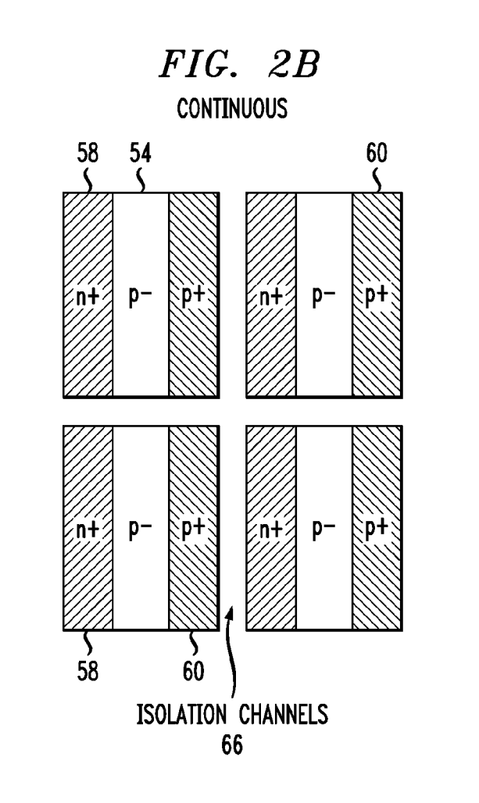
FIG. 2B is a top plan view of solar cell mesas formed in accordance with a first exemplary embodiment of the structure of FIG. 2A.
Figure 2C:
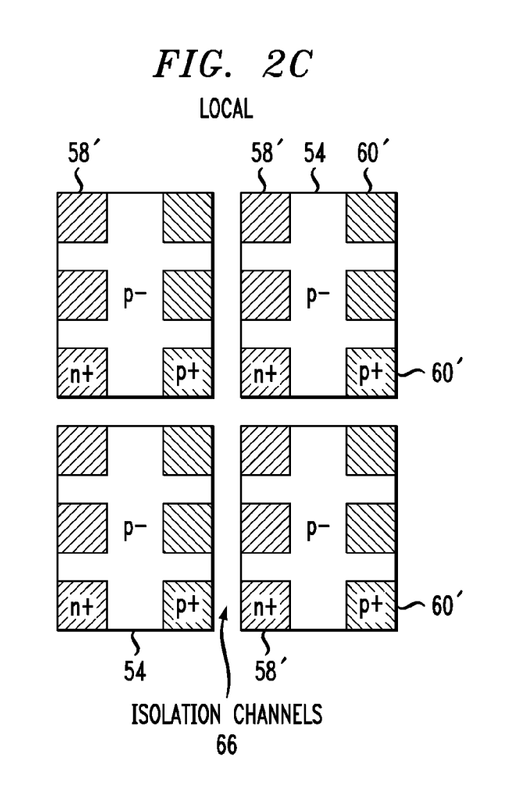
FIG. 2C is a top plan view of solar cell mesas formed in accordance with a second exemplary structure of FIG. 2A.

A first exemplary embodiment of a solar-powered autonomous CMOS circuit with monolithically integrated solar cell structures is shown in schematic form in FIGS. 2A and 2B. The exemplary integrated circuit 50 includes a device layer 52 on a SOI substrate 54. The device layer 52 may form the device layer 26 discussed above with respect to FIGS. 1A-D. The SOI substrate 54 includes a relatively thin handle layer 56 in this embodiment which, as discussed above, is formed by cleaving through the relatively thick handle substrate on which the device layer 52 was formed followed by etching of the handle layer 56 to effect solar cell structure isolation. The handle layer 56 in this embodiment is lightly doped, as indicated by the designation p− (or alternatively (n−) in the Figure. Oppositely and highly doped regions 58, 60, which can function as solar cell anode and cathode terminals, are formed in the handle layer and adjoin the insulating (BOX) layer. Some of the regions 58 are n+ (alternatively (p+)) and the others 60 are doped p+ (alternatively (n+)). In accordance with an exemplary method of fabrication, these regions 58, 60 are formed prior to spalling and etching of the handle layer. An antireflective coating 62 (ARC layer) is formed on the handle layer 56. The antireflective coating can further function as a passivation layer. A passivation layer (not shown) preferably covers the inner surfaces of the handle layer, not only the bottom surface.

The etching of the silicon handle layer 56 down to the insulating (BOX) layer 64, such as described above with respect to FIG. 1D, forms channels 66 within the layer. In the embodiment of FIGS. 2A and 2B, the channels 66 electrically isolate series connected solar cell structures 68A, 68B and other adjacent solar cells (not shown) that were formed prior to spalling and electrical isolation. It will be appreciated a plurality of such channels can be formed to electrically isolate additional sets of series connected solar cell structures during larger scale fabrication, such as shown in FIG. 2B. Such mesa isolation does not affect the electrical series connections of the solar cell structures.

The device layer 52 in this exemplary embodiment is a CMOS device layer including n-channel and p-channel FET devices. The layer includes a first FET device including doped source and drain regions 70A, 70B, a gate 72A, and a channel region 74A. It further includes a second FET device including doped source and drain regions 70C, 70C, a gate 72B, and a channel region 74B. Nitride spacers 76 adjoin the gates 72A, 72B in the exemplary embodiment. A first contact 78 ($V_{in}$) is formed at the top surface of the device layer 52. This contact 78 provides a gate voltage to the FET gates 72A, 72B. A second contact 80 is connected to ground, the source/drain region 70A of one of the FET devices, and a highly doped region 58 in the silicon handle layer 56. A third contact 82 ($V_{out}$) is connected between source and drain regions 70B, 70C of adjacent FET devices. A fourth contact 84 ($V_{dd}$) is connected to the highly doped contact region 60 of the second solar cell structure 68B by a via and to the source/drain region 70D of the second FET device. A fifth contact 86 is connected by conductive vias (for example, copper) to the first and second solar cell structures 68A, 68B, one of the vias contacting the highly doped p+ region 60 if the first solar cell structure, the other of the vias contacting the highly doped n+ region 58 of the second solar cell structure. A serial connection of the otherwise electrically isolated solar cell structures is accordingly provided. The series connection in this exemplary embodiment is effected during fabrication of the device layer. The output voltage of the second solar cell structure is added to that of the first solar cell structure in the exemplary circuit 50. Channels for the vias can be formed through reactive ion etching, a process that is familiar to those of skill in the art. The etch chemistry can be selective wherein the n+ and/or p+ doped regions function as etch stops or non-selective wherein the end point is determined by time etch or monitoring the byproduct of the etch process.

It will be appreciated that the thin Si handle layer 56 obtained after spalling offers fabrication advantages such as (i) formation of solar cell anode and cathode terminals (highly doped regions 58, 60) underneath the BOX layer 64 at the outset of the CMOS process (from the front surface by ion implantation through the box layer), (ii) electrical connection of solar cells during the back end of the line (BEOL) CMOS processing, (iii) electrical isolation of solar cell structures in an efficient manner. It will further be further appreciated that the doped contact regions can be formed as continuous structures, such as the regions 58, 60 shown in FIG. 2B, or as locally isolated regions. Locally isolated n+ and p+ contact regions 58', 60' are shown in the schematic top plan view showing solar cell mesas that can be employed to power a device layer 52 as shown in FIG. 2A.

Figure 3:
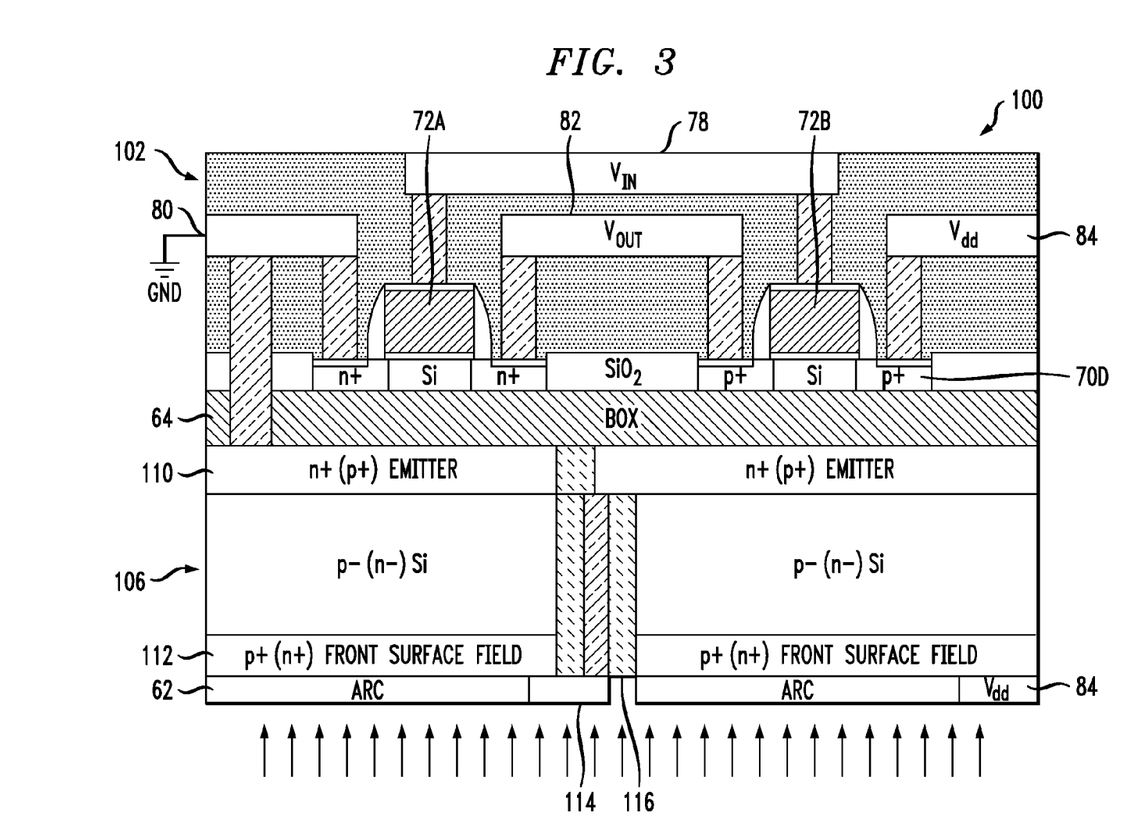
FIG. 3 is a schematic illustration of a structure having series connected solar cell structures in accordance with a second exemplary embodiment.

A second embodiment of a solar-powered autonomous CMOS circuit 100 with monolithically integrated, serially connected photovoltaic solar cell structures is shown in the schematic illustration provided in FIG. 3. The circuit 100 shares a number of elements common to those in the circuit 50 described above with respect to FIG. 2A. Such elements are designated by the same reference numerals. The device layer 102 is substantially the same as the device layer 52 described above, but does not include the contact 86 and its associated vias. The thin handle layer 106 obtained after spalling includes a plurality of solar cell structures, two of which are shown in the Figure. Each includes a highly doped emitter region 110 that adjoins the insulating layer 64. The emitter region can be epitaxially grown during SOI substrate fabrication. Alternatively, the emitter region can be formed via ion implantation following SOI substrate fabrication and prior to forming the device layer 102 on the SOI substrate. A front surface field layer 112 adjoins the bottom surface of the lightly doped handle layer 106. The front surface field layer is formed following spalling of the relatively thick handle substrate to separate the thin handle layer 106 and device layer 102 therefrom as described above with respect to FIG. 1B. The front surface field layer can be grown epitaxially or as an amorphous layer(s). Once the device layer 102 is formed, the temperature of further fabrication processes (e.g. CVD) should not exceed 500° C. to avoid damaging the CMOS circuit therein. It will be appreciated that the front surface field layer 112 formed on the thin handle layer can be single or multi-layer and that the doping thereof can be substantially uniform or graded. Exemplary front surface fields may comprise low temperature, highly doped epitaxial silicon, a stack of hydrogenated amorphous silicon (intrinsic and doped), or a combination thereof. Selective etching of the thin handle layer 106 to the insulating layer 64, as discussed above with respect to FIG. 1D, is conducted to separate the emitter layer formed on the SOI substrate into two emitter layers, thereby forming two solar cell structures. It will be appreciated that the patterning comprises two steps in this exemplary embodiment. One step includes mesa isolation all the way down to the BOX layer 64. The second step entails mesa isolation down to the heavily doped region 110. The front surface field is formed prior to the solar cell isolation process. Unlike the formation of the circuit 50 discussed with respect to FIG. 2A, series connection of the solar cell structures in the circuit 100 is effected following device layer formation, spalling, and solar cell structure isolation. A bottom contact and associated via 114 electrically connects the front surface field layer of the first solar cell structure with the emitter layer 110 of the second solar cell structure. The photovoltaic output of the two solar cell structures in the thin handle layer is accordingly added. A dielectric material 116 (e.g. $SiO_2$, $SiN_x$, metal oxide dielectrics such as $Al_2O_3$ or $HfO_2$) surrounds the via. The anti-reflective coating layer 62 can be deposited prior to or after solar cell structure isolation so long as it is not made from a conductive material. If made of a conductive material such as a transparent conductive oxide (TCO), it would be deposited after the formation of the front surface field and prior to solar cell structure isolation.

Figure 4:
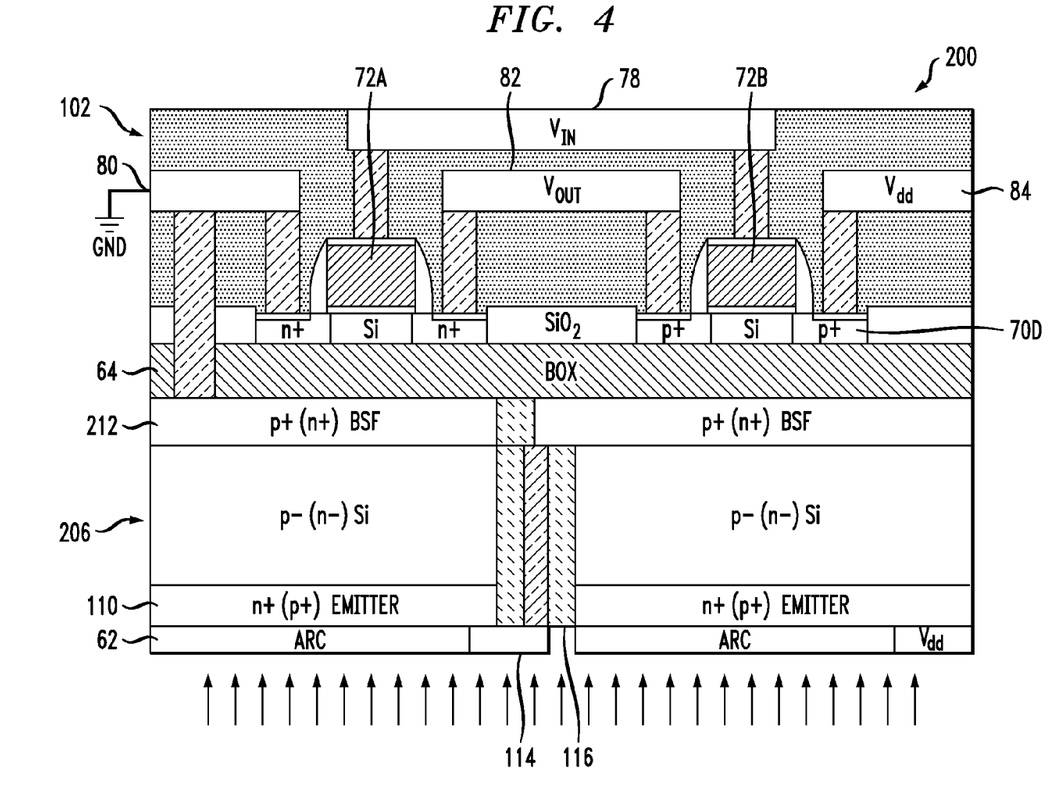
FIG. 4 is a schematic illustration of a structure having series connected solar cell structures in accordance with a third exemplary embodiment.

A third embodiment of an autonomous CMOS circuit 200 having integrated solar cell structures is shown in the schematic illustration provided in FIG. 4. The device layer is identical to that shown in FIG. 3 and accordingly has been assigned the same reference numeral 102. The thin handle layer 206 is similar to the handle layer 106 shown in FIG. 3, though the positions of the highly doped regions are reversed. A back surface field (BSF) layer 212 is formed in the thin handle layer just beneath the insulating layer 64. An emitter layer 110 is formed on the surface of the thin handle layer 206 that is exposed following cleavage from the relatively thick SOI substrate on which the device layer 102 was formed. Exemplary emitter layers may comprise low temperature, highly doped epitaxial silicon, a stack of hydrogenated amorphous silicon (intrinsic and doped), or a combination thereof. As in the circuit 100 described above, only one of the solar cell structure contacts is formed prior to spalling. In the "front emitter" structure shown in FIG. 4, the BSF layer is formed prior to spalling. Series connection between the two illustrated solar cell structures is effected following spalling, formation of the emitter layer, and etching a channel within the thin handle layer to form two BSF layers.

Given the discussion thus far, an exemplary structure includes a silicon-on-insulator substrate including a semiconductor layer, a handle layer having a thickness of fifty microns or less, and an insulating layer between the semiconductor layer and handle layer, the handle layer including a plurality of electrically isolated solar cell structures. Handle layers 56, 106 and 206 comprising isolated solar cell structures are shown, for example, in FIGS. 2A, 3 and 4, respectively. The exemplary structure further includes a device layer comprising an integrated circuit such as a CMOS circuit on the semiconductor layer of the silicon-on-insulator substrate. Such a device layer 52 is shown in FIG. 2A. Another exemplary device layer 102 is shown in FIGS. 3 and 4. It will be appreciated that the device layer may be comprised of elements other than those shown in the figures. An integrated circuit is generally understood as comprising active and passive circuit elements such as diodes, resistors, capacitors, non-volatile memory cells, field effect transistors, bipolar junction transistors, photodiodes, sensors and/or other elements. An electrical series connection is provided between at least two of the solar cell structures. In the embodiment of FIG. 2A, the series connection between the solar cell structures 68A and 68B is formed partially in the device layer. In the embodiments of FIGS. 3 and 4, the series connection between solar cell structures is entirely within the handle layer 106, 206. An electrical connection is provided between the series connected solar cell structures and the device layer. The contacts 80, 84 ($V_{dd}$) and associated vias in FIGS. 2-4 show exemplary connections. In one or more embodiments of the exemplary structure, the electrical series connection between the at least two solar cell structures is partially within the device layer. As discussed above, FIG. 2 illustrates such a connection wherein the contact 86 is within the device layer 52 and vias electrically connected to the contact 86 extend through the insulating layer to the solar cell structures within the handle layer. In one or more embodiments of the exemplary structure, the semiconductor layer comprises silicon and the insulating layer comprises a buried oxide layer. A channel is located between the series connected solar cell structures and extends through the handle layer to the buried oxide layer. FIG. 2A includes a schematic illustration of such a channel 66. The channel electrically isolates the solar cell structures. In some embodiments, each of the solar cell structures comprises first and second, oppositely doped contact regions adjoining the insulating layer. FIG. 2A shows oppositely doped contact regions 58, 60 adjoining the insulating layer. The series connection further includes first and second vias extending through the insulating layer in some embodiments, each via contacting one of the doped contact regions. A power supply via extends through the insulating layer, the power supply via electrically communicating with one of the doped contact regions and the integrated circuit of the device layer. FIG. 2A shows such a via connected to the contact 84. One or more exemplary embodiments of the exemplary structure has an integrated circuit that further comprises a CMOS circuit comprising n-channel and p-channel FET devices, each of the FET devices including a gate and doped first and second source/drain regions operatively associated with the gate, an electrical connection between the second source/drain region of one of the FET devices with the first source/drain region of a second of the FET devices, the power supply via being in electrical communication with the second source/drain region of the second FET device. The CMOS circuit further comprises other active and passive elements (not shown) enabling various functions such as sensing, computation, and/or other functions. A contact such as contact 78 electrically communicates with the gates of the one of the FET devices and the second FET device. An anti-reflective coating is provided on the handle layer in some embodiments. Each solar cell structure includes first and second doped contact regions adjoining the insulating layer in one or more embodiments of the structure, the first and second doped contact regions having opposite doping types. FIG. 2A discloses a structure having such contact regions 58, 60. The first and second contact regions may be continuous in some exemplary embodiments, as shown in FIG. 2B, or be comprised of locally isolated regions in other embodiments. Locally isolated, non-continuous contact regions 58', 60' are shown in FIG. 2C.

An exemplary structure according to one or more embodiments discussed in the preceding paragraph has an electrical series connection between solar cell structures entirely within the handle layer, such as shown in FIGS. 3 and 4. The semiconductor layer comprises silicon and the insulating layer comprises a buried oxide layer in some embodiments of the structures shown in FIGS. 3 and 4. In one or more exemplary embodiments of the structure, the solar cell structure comprises a photosensitive base and an emitter layer 110 adjoining the insulating layer as shown in FIG. 3. A front surface field layer 112 adjoins a surface of the handle layer in the illustrative embodiment of FIG. 3. The emitter and/or front surface field layers of each solar cell structure in the embodiment of FIG. 3 may be either continuous or comprised of locally isolated regions. Solar cell structures in some embodiments comprises a first doped contact region adjoining the insulating layer and a second doped contact region adjoining a surface of the handle layer, the second doped contact region having a doping type opposite to the doping type of the first contact region. FIGS. 3 and 4 show exemplary structures. The contact region adjoining the insulating layer comprises a back surface field layer 212 in some embodiments, such as shown in FIG. 4. A via electrically connects a doped contact region of a first solar cell structure with a first doped contact region of a second solar cell structure in one or more embodiments, such as those shown in FIGS. 3 and 4. A via extending through the insulating layer and electrically communicates with one of the doped contact regions of a solar cell structure and the integrated circuit in exemplary embodiments of the structure. The integrated circuit in some embodiments further comprises n-channel and p-channel FET devices, each of the FET devices including a gate and doped first and second source/drain regions operatively associated with the gate, an electrical connection between the second source/drain region of one of the FET devices with the first source/drain region of a second of the FET devices, the power supply via being in electrical communication with the second source/drain region of the second FET device. A contact electrically communicates with the gates of the FET devices such as shown in FIGS. 3 and 4, wherein contact 78 is electrically connected by vias to gates 72A and 72B. An anti-reflective coating is on one of the doped contact regions in some embodiments. In the embodiment of FIG. 3, the anti-reflective coating adjoins the front surface field layer of each solar cell structure while in the embodiment of FIG. 4 it adjoins the emitter layer 110. As shown in FIG. 1C, some embodiments of the exemplary structure further include a stressor layer attached to the device layer and a flexible handle layer attached to the stressor layer. As discussed above, a direct attachment of the stressor layer to the device layer is not required. A channel extends through the handle layer, the channel having a closed end defined by the insulating layer in the further embodiment of FIG. 1D. The channel provides electrical isolation.

A structure in accordance with a further exemplary embodiment includes a silicon-on-insulator substrate including a semiconductor layer, a handle layer, and an insulating layer between the semiconductor layer and handle layer. The handle layer includes a photosensitive base portion, a plurality of highly doped first contact regions adjoining the insulating layer, and a plurality of highly doped second contact regions adjoining the insulating layer, the first contact regions having a doping type opposite to the doping type of the second contact regions. A device layer comprising a CMOS circuit is on the semiconductor layer of the silicon-on-insulator substrate. A stressor layer attached to the device layer and a flexible handle layer is attached to the stressor layer. FIG. 1C shows an exemplary structure 40 including a flexible handle layer 30, stressor layer 28, device layer 26 and a handle layer following spalling while FIG. B shows an exemplary structure prior to spalling. Specific details of the exemplary structure are shown by way of example in FIG. 2A, including the first and second contact regions 58, 60 that adjoin the insulating layer 64. In one or more embodiments thereof, the semiconductor layer comprises silicon and the insulating layer comprises a buried oxide (BOX) layer. A channel extends through the handle layer to the buried oxide layer, the handle layer having a thickness of fifty microns or less. Channels are shown by way of example in FIGS. 1D and 2A. The channels (e.g. channel 66) are formed after spalling in the relatively thin (fifty microns or less) handle layer. The structure further includes an electrical series connection in one or more embodiments between one of the first contact regions and one of the second contact regions, the electrical series connection extending through the insulating layer and the device layer. FIG. 2A illustrates such an electrical series connection between contact regions 58, 60. The CMOS circuit further comprises n-channel and p-channel FET devices in some embodiments. One of the first contact regions is electrically connected to one of the FET devices and one of the second contact regions is electrically connected to another of the FET devices. In the illustrative embodiment of FIG. 2A, such connections are effected by contacts 80, 84 and associated vias.

A first exemplary method includes obtaining a silicon-on-insulator substrate including a semiconductor layer, a handle substrate, and an insulating layer between the semiconductor layer and handle substrate, the silicon-on-insulator substrate including a plurality of solar cell structures. A device layer (e.g. layer 26) comprising an integrated circuit is formed on the semiconductor layer of the silicon-on-insulator substrate. The method further includes connecting the solar cell structures in series, for example solar cell structures 68A, 68B shown in FIG. 2A, attaching a stressor layer (e.g. layer 28) to the silicon-on-insulator substrate over the device layer, attaching a flexible handle layer (e.g. layer 30) to the stressor layer, cleaving through the handle substrate by exerting a force on the flexible handle layer, separating a cleaved portion of the handle substrate from the handle substrate, leaving a thin handle layer such as layer 22A in FIG. 1C attached to the device layer and comprising the plurality of solar cell structures, and removing a selected portion (e.g. channel 66 in FIG. 2A or the dielectric-filled channel shown in FIG. 3) of the thin handle layer, thereby electrically isolating the solar cell structures from each other. In one or more further embodiments of the method, the step of connecting the solar cell structures in series comprises metalizing the device layer prior to removing the selected portion of the thin handle layer such that metal extends through the insulating layer and further such that the solar cell structures remain serially connected following the step of removing the selected portion of the thin handle layer. As discussed above with respect to FIG. 2A, electrical series connection of the solar cell structures is provided during formation of the device layer 52. Subsequent formation of the channel 66 to electrically isolate the solar cell structures does not affect the series connection between such structures in this embodiment. The step of obtaining the silicon-on-insulator substrate further includes forming solar cell anode and cathode terminals beneath the insulating layer prior to forming the device layer in one or more embodiments of the method. Ion implantation through the insulating layer is one technique used form the anode and cathode terminals (contact regions) within the handle substrate, after which the device layer such as layer 52 can be formed using conventional CMOS technology. The plurality of solar cell structures are formed while forming the silicon-on-insulator substrate in some embodiments of the method.

A second exemplary method includes obtaining a structure including i) a silicon-on-insulator substrate comprising a handle substrate, a semiconductor layer, an insulating layer between the handle substrate and semiconductor layer, and a plurality of solar cell structures connected in series with each other, ii) a device layer comprising an integrated circuit on the semiconductor layer of the substrate, iii) a stressor layer secured to the structure above the device layer, and iv) a flexible handle layer secured to the stressor layer. Such a structure is shown in FIG. 1A, with further reference to FIG. 2A for its disclosure of series connected solar cell structures 68A, 68B. The method further includes cleaving through the handle substrate of the silicon-on-insulator substrate by exerting a force on the flexible handle layer, separating a cleaved portion of the handle substrate beneath the fracture from the substrate, leaving a thin handle layer (such as layer 56 in FIG. 2A) comprising the plurality of solar cell structures attached to the device layer, and removing a selected portion of the thin handle layer, thereby electrically isolating the solar cell structures from each other. The electrical series connection between solar cell structures remains following removal of the selected portion of the thin handle layer in this embodiment, such as shown in FIG. 2A, wherein formation of the channel 66 leaves the contact 86 and associated vias intact while otherwise electrically isolating the solar cell structures. FIGS. 2B and 2C include further details of exemplary embodiments showing mesa isolation of series connected solar cell structures. As discussed above with respect to FIG. 2A, solar cell structure electrical isolation is achieved through formation of a channel 66 to the insulating layer 64. In one further exemplary aspect of the second exemplary method, the integrated circuit comprises complementary metal-oxide-semiconductor devices and the solar cell structures are connected in series by a metalizing layer that extends through the insulating layer from the device layer and electrically contacts the solar cell structures. FIG. 2A illustrates such an arrangement.

A method in accordance with a third aspect includes obtaining a silicon-on-insulator substrate including a semiconductor layer, a handle substrate, and an insulating layer between the semiconductor layer and handle substrate, the silicon-on-insulator substrate including a first highly doped contact region (such as the emitter region 110 shown in FIG. 3 or the BSF region 212 shown in FIG. 4) having a first doping type adjoining the insulating layer, forming a device layer comprising an integrated circuit on the semiconductor layer of the silicon-on-insulator substrate, attaching a stressor layer to the silicon-on-insulator substrate over the device layer and attaching a flexible handle layer to the stressor layer. The method further includes cleaving through the handle substrate by exerting a force on the flexible handle layer, separating a cleaved portion of the handle substrate from the substrate, leaving a thin handle layer attached to the device layer and comprising the first highly doped contact region adjoining the insulating region and an exposed surface, forming a second highly doped contact region (for example, layer 112 in FIG. 3 or layer 110 in FIG. 4) on the exposed surface of the thin handle layer, the second highly doped contact region having a second doping type opposite to the first doping type, forming first and second electrically isolated solar cell structures from the thin handle layer and the first and second highly doped contact regions, and connecting the solar cell structures in series. As shown in FIG. 1D, the electrically isolated solar cell structures may be formed by the formation of a channel extending through the handle layer to the insulating (BOX) layer. Formation of a thin handle layer of fifty microns or less facilitates channel formation and connection of the solar cell structures in series. One or more further embodiments of the third exemplary method includes electrically connecting the series connected solar cell structures to the integrated circuit. Power supply vias and associated contacts are shown in the exemplary embodiments of FIGS. 3 and 4 for electrically connecting series-connected solar cell structures to an integrated circuit. Such vias and contacts are formed using metalizing techniques familiar to those of skill in the art.

The flowchart in the Figures illustrates the operation of possible implementations of systems, methods and/or computer program products according to various of the embodiments present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "top" and "bottom" are used to designate relative positions of elements as opposed to elevation. For example, the "top" surface of a structure can face up, down, or any other direction.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
a silicon-on-insulator substrate including a semiconductor layer, a handle layer having a thickness of fifty microns or less, and an insulating layer between the semiconductor layer and handle layer, the handle layer including a plurality of electrically isolated solar cell structures;
a device layer comprising an integrated circuit on the semiconductor layer of the silicon-on-insulator substrate;
an electrical series connection between at least two of the solar cell structures, and
an electrical connection between the series connected solar cell structures and the integrated circuit.

2. The structure of claim 1, wherein the electrical series connection between the at least two solar cell structures is partially within the device layer.

3. The structure of claim 2, wherein the semiconductor layer comprises silicon and the insulating layer comprises a buried oxide layer, further including a channel between and electrically isolating the series connected solar cell structures and extending through the handle layer to the buried oxide layer.

4. The structure of claim 2, wherein each of the solar cell structures comprises first and second, oppositely doped contact regions adjoining the insulating layer.

5. The structure of claim 4, wherein the series connection further includes first and second vias extending through the insulating layer, each via contacting one of the doped contact regions.

6. The structure of claim 5, further including a power supply via extending through the insulating layer, the power supply via electrically communicating with one of the doped contact regions and the integrated circuit.

7. The structure of claim 6, wherein the integrated circuit further comprises a CMOS circuit comprising n-channel and p-channel FET devices, each of the FET devices including a gate and doped first and second source/drain regions operatively associated with the gate, an electrical connection between the second source/drain region of one of the FET devices with the first source/drain region of a second of the FET devices, the power supply via being in electrical communication with the second source/drain region of the second FET device.

8. The structure of claim 1, wherein each solar cell structure includes first and second doped contact regions adjoining the insulating layer, the first contact region of each solar cell structure having a first doping type opposite the doping type of the second contact region.

9. The structure of claim 8, wherein each of the first and second contact regions is comprised of a plurality of locally isolated contact regions.

10. The structure of claim 1, wherein the electrical series connection between the at least two solar cell structures is entirely within the handle layer.

11. The structure of claim 10, wherein the semiconductor layer comprises silicon and the insulating layer comprises a buried oxide layer.

12. The structure of claim 10, wherein each of the solar cell structures comprises an emitter layer adjoining the insulating layer and a front surface field layer adjoining a surface of the handle layer.

13. The structure of claim 10, wherein each of the solar cell structures comprises a first doped contact region adjoining the insulating layer and a second doped contact region adjoining a surface of the handle layer, the second doped contact region having a doping type opposite to the doping type of the first contact region.

14. The structure of claim 13, wherein the first contact region comprises a back surface field layer.

15. The structure of claim 13, wherein the electrical series connection includes a via electrically connecting the second doped contact region of a first of the solar cell structures with the first doped contact region of a second of the solar cell structures.

16. The structure of claim 15, further including a power supply via extending through the insulating layer, the power supply via electrically communicating with one of the doped contact regions and the integrated circuit.

17. The structure of claim 16, wherein the integrated circuit further comprises n-channel and p-channel FET devices, each of the FET devices including a gate and doped first and second source/drain regions operatively associated with the gate, an electrical connection between the second source/drain region of one of the FET devices with the first source/drain region of a second of the FET devices, the power supply via being in electrical communication with the second source/drain region of the second FET device.

18. The structure of claim 17, wherein the device layer further includes a contact electrically communicating with the gates of said one of the FET devices and the second FET device.

19. The structure of claim 18, further including an antireflective coating on the second doped contact region.

20. The structure of claim 1, further including a metal stressor layer attached to the device layer and a flexible handle layer attached to the metal stressor layer.

21. The structure of claim 20, further including a channel extending through the handle layer, the channel having a closed end defined by the insulating layer.

22. A structure comprising:
   a silicon-on-insulator substrate including a semiconductor layer, a handle layer, and an insulating layer between the semiconductor layer and handle layer, the handle layer including a photosensitive base portion, a plurality of highly doped first contact regions adjoining the insulating layer, and a plurality of highly doped second contact regions adjoining the insulating layer, the first contact regions having a doping type opposite to the doping type of the second contact regions;
   a device layer comprising a complementary metal-oxide-semiconductor (CMOS) circuit on the semiconductor layer of the silicon-on-insulator substrate;
   a stressor layer attached to the device layer, and
   a flexible handle layer attached to the stressor layer.

23. The structure of claim 22, wherein the semiconductor layer comprises silicon and the insulating layer comprises a buried oxide layer, further including a channel extending through the handle layer to the buried oxide layer, the handle layer having a thickness of fifty microns or less.

24. The structure of claim 23, further including an electrical series connection between one of the first contact regions and one of the second contact regions, the electrical series connection extending through the insulating layer and the device layer.

25. The structure of claim 24, wherein the CMOS circuit further comprises n-channel and p-channel FET devices, one of the first contact regions being electrically connected to one of the FET devices and one of the second contact regions being electrically connected to another of the FET devices.

* * * * *